(12) United States Patent
Hurkx et al.

(10) Patent No.: US 8,962,461 B2
(45) Date of Patent: Feb. 24, 2015

(54) GAN HEMTS AND GAN DIODES

(71) Applicant: NXP B.V., Eindhoven (NL)

(72) Inventors: Godefridus Adrianus Maria Hurkx, Best (NL); Jeroen Antoon Croon, Eindhoven (NL); Johannes Josephus Theodorus Marinus Donkers, Valkenswarrd (NL); Stephan Heil, Eindhoven (NL); Jan Sonsky, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/108,042

(22) Filed: Dec. 16, 2013

(65) Prior Publication Data
US 2014/0167064 A1    Jun. 19, 2014

(30) Foreign Application Priority Data

Dec. 19, 2012   (EP) .................................... 12198130

(51) Int. Cl.
| | |
|---|---|
| *H01L 21/28* | (2006.01) |
| *H01L 21/44* | (2006.01) |
| *H01L 29/47* | (2006.01) |
| *H01L 29/40* | (2006.01) |
| *H01L 29/778* | (2006.01) |
| *H01L 29/872* | (2006.01) |

(Continued)

(52) U.S. Cl.
CPC ............ *H01L 29/475* (2013.01); *H01L 29/401* (2013.01); *H01L 29/778* (2013.01); *H01L 29/872* (2013.01); *H01L 23/3171* (2013.01); *H01L 29/42316* (2013.01); *H01L 29/7786* (2013.01); *H01L 29/2003* (2013.01); *H01L 2924/0002* (2013.01); *H01L 23/3192* (2013.01)

USPC ........... 438/570; 438/309; 438/316; 438/312; 438/680; 257/183; 257/200; 257/E21.006; 257/E21.047; 257/E21.17; 257/E21.371; 257/E21.458

(58) Field of Classification Search
USPC ......... 438/141, 309, 316, 312, 169, 570, 572, 438/602, 603, 604, 678, 679, 680, 706, 745, 438/772, 791; 257/183, 200, E21.006, 257/E21.047, E21.17, E21.351, E21.371, 257/E21.458
See application file for complete search history.

(56) References Cited

U.S. PATENT DOCUMENTS

| | | | |
|---|---|---|---|
| 7,030,428 B2 * | 4/2006 | Saxler ........................... | 257/194 |
| 7,075,125 B2 * | 7/2006 | Saito et al. .................... | 257/194 |

(Continued)

FOREIGN PATENT DOCUMENTS

WO    2011/163318 A2    12/2011

OTHER PUBLICATIONS

Saito, W., "Reliability of GaN-HEMTs for High-Voltage Switching Applications", IEEE International Reliability Physics Symposium (IRPS), pp. 4E.1.1-4E.1.5 (Apr. 2011).

(Continued)

*Primary Examiner* — David Nhu (57) ABSTRACT

Consistent with an example embodiment, a GaN heterojunction structure has a three-layer dielectric structure. The lowermost and middle portions of the gate electrode together define the gate foot, and this is associated with two dielectric layers. A thinner first dielectric layer is adjacent the gate edge at the bottom of the gate electrode. The second dielectric layer corresponds to the layer in the conventional structure, and it is level with the main portion of the gate foot.

15 Claims, 6 Drawing Sheets

(51) Int. Cl.
*H01L 23/31* (2006.01)
*H01L 29/423* (2006.01)
*H01L 29/20* (2006.01)

(56) References Cited

U.S. PATENT DOCUMENTS

| | | | |
|---|---|---|---|
| 7,709,269 B2 * | 5/2010 | Smith et al. | 436/182 |
| 2007/0164322 A1 | 7/2007 | Smith et al. | |
| 2012/0119260 A1 | 5/2012 | Radulescu et al. | |
| 2013/0299846 A1 | 11/2013 | Donkers et al. | |
| 2013/0320400 A1 * | 12/2013 | Hurkx et al. | 257/192 |

OTHER PUBLICATIONS

Chou, Y.C. et al. "Degradation of AlGaN/GaN HEMTs Under Elevated Temperature Lifetesting", Elsevier Microelectronics Reliability, vol. 44, pp. 1033-1038 (2004).

Extended European Search Report for EP Patent Appln. No. 12198130.2 (May 2, 2013).

* cited by examiner

GAN HEMTS AND GAN DIODES

CROSS-REFERENCE TO RELATED APPLICATIONS

This application claims the priority under 35 U.S.C. §119 of European patent application no. 12198130.2, filed on Dec. 19, 2012, the contents of which are incorporated by reference herein.

This invention relates to GaN devices, such as high electron mobility transistors (HEMTs) and diodes, and relates to the problem of gate leakage in these devices.

In recent years, GaN high-mobility transistors (HEMTs) and Schottky diodes have drawn a lot of attention regarding their high potential to replace Si or SiC for use as High Voltage (HV) devices as a result of enhanced high-power performance. This follows from inherent high-density two-dimensional electron gas (2DEG), high electron mobility, and high critical breakdown electric field. As a consequence, the wide bandgap AlGaN/GaN HEMTs are emerging as excellent candidates for radio-frequency (RF) and microwave power amplifiers.

Figure 1:
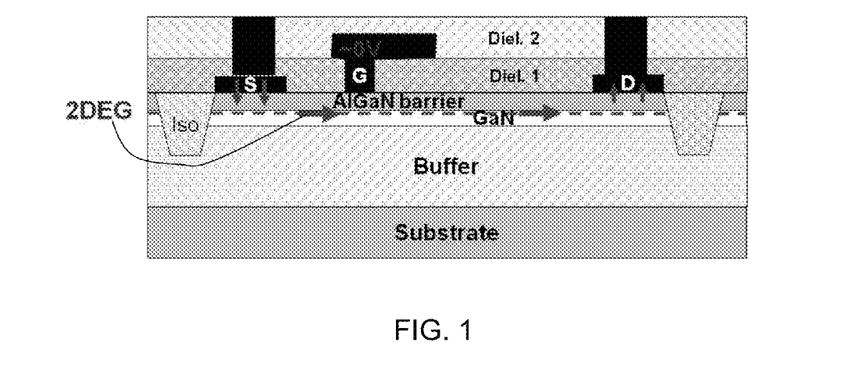
FIG. 1 shows a known structure of a GaN HEMT.

The basic structure of a HEMT is shown in FIG. 1. The current flows between drain (D) and source (S) via the so-called two-dimensional electron gas (2DEG) that is formed at the interface between an AlGaN barrier layer and a top GaN layer (or a capping layer if one is present—not shown in FIG. 1).

This heterojunction structure incorporates a junction between two materials with different band gaps as the channel instead of a doped region.

In the framework of AlGaN/GaN heterostructures, there is often no dopant required due to the strong spontaneous and piezoelectric polarization effect in such systems. For example, electrons from surface donors can be swept into the GaN channel by the intrinsic polarization induced electric field. In this instance, the electrons can move quickly without colliding with any impurities, due to the unintentionally doped (e.g., not intentionally doped) layer's relative lack of impurities or dopants, from which the electrons cannot escape.

The net result of such a heterojunction is to create a very thin layer of highly mobile conducting electrons with very high concentration or density, giving the channel very low resistivity. This layer is known as the two-dimensional electron gas (2DEG). This effect for instance can be utilized in a field-effect transistor (FET), where the voltage applied to the Schottky gate alters the conductivity of this layer to form transistor structures.

One kind of such a transistor is a high-electron mobility transistor (HEMT) including Gallium Nitride and is known as an Aluminum Gallium Nitride/Gallium Nitride (AlGaN/GaN) HEMT. Typically, AlGaN/GaN HEMTs can be fabricated by growing crystalline films of GaN, AlGaN, etc. on a substrate, e.g., sapphire, silicon (Si)(111), silicon carbide (SiC) and so on, through an epitaxial crystal growth method, e.g., metal organic chemical vapor deposition (MOCVD), molecular beam epitaxy (MBE) and so on, and processing the epitaxial substrate thus grown, to form the desired structures.

In some devices, the semiconductor device is switched between the off-state, in which the 2DEG is disrupted under the Schottky gate, and an on-state in which a high current is produced at a low voltage. The design of such devices typically targets a trade-off between power losses in the on-state, off-state and during switching.

Switching-off is achieved by applying a suitable voltage on the Schottky metal (G) such that the 2DEG under the metal disappears. A GaN Schottky diode can be simply thought of as a HEMT without a source contact. In a Schottky diode the current flows between gate and drain. The design of these devices is such that an optimum trade-off is found between the power losses in on-state, off-state and during switching.

Figure 2:
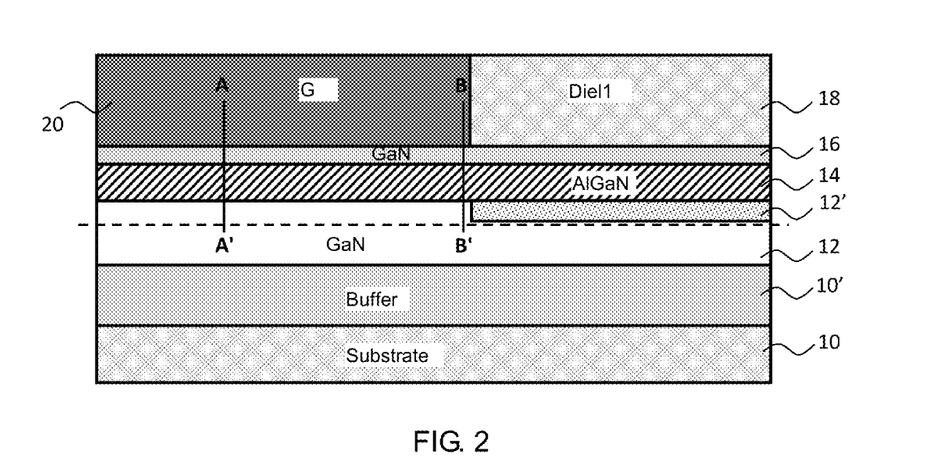
FIG. 2 shows the gate area of the GaN HEMT of FIG. 1 in more detail.

FIG. 2 shows the gate area of the device of FIG. 1 in more detail. A silicon substrate 10 comprises a GaN buffer layer 10' on which an epitaxially grown GaN layer 12 and an AlGaN barrier layer 14 are formed. The GaN layer 12 and the AlGaN barrier layer 14 define a heterojunction, at the interface of which a 2DEG 12' may form. A GaN capping layer 16 (which is optional and is not shown in FIG. 1) separates a first ($Si_3N_4$) dielectric layer 18 and a Schottky gate 20 from the heterojunction.

The semiconductor device typically will comprise at least one other (ohmic) electrode, to form a Schottky diode in case of a two-terminal device or two other electrodes in the case of a three-terminal HEMT device, but these electrodes are omitted from FIG. 2 for the sake of clarity only.

The semiconductor device typically has an on-state, in which the 2DEG 12' laterally extends over the full width of the device, e.g. between the source and drain of a HEMT, and an off-state, in which a (negative) bias or gate voltage is applied to the Schottky gate to disrupt the 2DEG 12' underneath the Schottky gate 20. This is the situation shown in FIG. 2, where the 2DEG 12' aligns with the edge of the Schottky gate 20, i.e. the interface between the Schottky gate 20 and the dielectric layer 18.

In a normally-on device, the 2DEG 12' extends over the full width of the device in the absence of a gate bias. In a normally-off device, the 2DEG 12' is absent underneath the Schottky gate 20 in the absence of a gate bias.

One of the problems with such devices is a high leakage current during the off-state. Such a leakage current is determined by the potential barrier for electrons between the Schottky metal and the 2DEG. A high off-state leakage current is caused by tunnelling through the Schottky/AlGaN barrier near the gate edge. There is also a problem that the on-state resistance is significantly higher under dynamic conditions (e.g. switching, pulsed, RF) than under DC conditions. This on-state resistance may also change during the lifetime of the device and may therefore cause reliability issues.

The passivation layer(s) on top of the semiconductor surface has a strong influence on the leakage current and the on-state resistance, and in particular their behaviour on short (switching, RF) and long (degradation) time scales.

According to the invention, there is provided a device and method as defined in the claims.

In one aspect, the invention provides a GaN hetereojunction semiconductor device comprising:

a substrate;

a layer structure having a first layer having a first bandgap and a second layer having a second bandgap, wherein the first layer is located between the substrate and the second layer; and a Schottky gate electrode and a first further electrode each conductively coupled to a different area of the heterojunction, said Schottky gate electrode comprising a central region and an edge region, wherein the Schottky gate electrode comprises:

a lowermost portion which is co-planar with a first dielectric layer portion over the second layer;

a middle portion which is co-planar with a second dielectric layer, the middle portion overlapping the lowermost portion; and an upper portion which is co-planar with a third dielectric layer, the upper portion overlapping the middle portion.

By "overlap" is meant that one layer is over the other, but also extending beyond (i.e. overhanging) the lower layer at least over one edge. This structure has three dielectric layers. The lowermost and middle portions of the gate electrode together define the gate foot, and this is associated with two dielectric layers. A thinner first dielectric layer is adjacent the gate edge at the bottom of the gate electrode, and it fills the area where the middle portion overlaps/overhangs the lowermost portion. The second dielectric layer corresponds to the layer in the conventional structure, and it is coplanar (i.e. level) with the main middle portion of the gate foot.

The additional (first) dielectric layer improves the leakage current performance and reduces the on-state resistance of the device.

The first dielectric layer is preferably over the second dielectric layer (i.e. the second layer is deposited first), and the second dielectric layer has a well in the region of the gate and in which the first dielectric layer is formed. In this way, the first dielectric layer portion extends to the bottom of the dielectric layer structure in the region of the gate, and it is the only one of the first, second and third dielectric layers beneath the middle gate portion, i.e. the overlap/overhang of the gate middle portion over the gate lowermost portion.

The first dielectric layer can comprise an LPCVD layer, and the second and third dielectric layers can comprise PECVD layers. All three dielectric layers can for example comprise SiN.

The length of the overlap of the middle portion over the lowermost portion is in the range 10 nm to 100 nm. The overlap is greater than the twice the thickness of the first dielectric layer, which is for example is in the range 5 to 50 nm. The overlap is more preferably more than three times the thickness.

In another aspect, the invention provides a method of manufacturing a semiconductor device comprising:

providing a substrate carrying a layer structure having a first layer having a first bandgap and a second layer having a second bandgap, wherein the first layer is located between the substrate and the second layer, the interface between the first layer and second layer defining a heterojunction;

forming a dielectric layer structure over the second layer;

forming a Schottky gate electrode and a first further electrode each conductively coupled to a different area of the heterojunction, said Schottky gate electrode comprising a central region and an edge region, wherein the Schottky gate electrode comprises:

a lowermost portion which is co-planar with a first dielectric layer portion over the second layer;

a middle portion which is co-planar with a second dielectric layer, the middle portion overlapping the lowermost portion; and an upper portion which is co-planar with a third dielectric layer, the upper portion overlapping the middle portion.

Forming the dielectric layer structure can comprise:

forming the second dielectric layer;

forming a well in the second dielectric layer in the region of the gate;

forming the first dielectric layer over the second dielectric layer and into the well;

removing a region of the first dielectric layer in the well;

forming the third dielectric layer over the first dielectric layer, wherein the first dielectric layer portion is the only one of the first, second and third dielectric layers beneath the overlap of the middle portion over the lowermost portion.

Examples of the invention will now be described in detail with reference to the accompanying drawings, in which.

The invention provides a GaN HEMT structure with a three-layer dielectric structure. The lowermost and middle portions of the gate electrode together define the gate foot, and this is associated with two dielectric layers. A thinner first dielectric layer is adjacent the gate edge at the bottom of the gate electrode. The second dielectric layer corresponds to the layer in the conventional structure, and it is level with the main portion of the gate foot.

The issues addressed by the invention will first be discussed in more detail before describing the invention in detail.

The problem of the passivation layer(s) on top of the semiconductor surface having a strong influence on the leakage current and the on-state resistance can be understood by considering the I-V characteristic of the corresponding metal insulator semiconductor HEMT.

Figure 3:
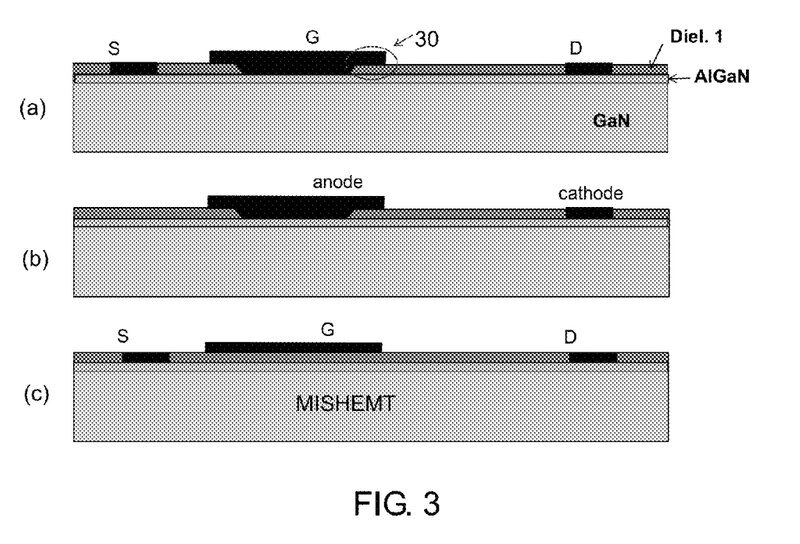
FIG. 3 shows for comparison the basic structure of a GaN HEMT, a GaN diode and a MISHEMT.

FIG. 3(a) shows in simplified form the GaN/AlGaN high-mobility transistor (HEMT) structure and FIG. 3(b) shows a GaN/AlGaN Schottky diode structure. The gate head region 30 labelled in FIG. 3(a) corresponds to the gate edge region shown in FIG. 2, although FIG. 2 does not show the top head part of the gate structure. A metal insulator semiconductor HEMT ("MISHEMT") is shown in FIG. 3(c).

Figure 4:
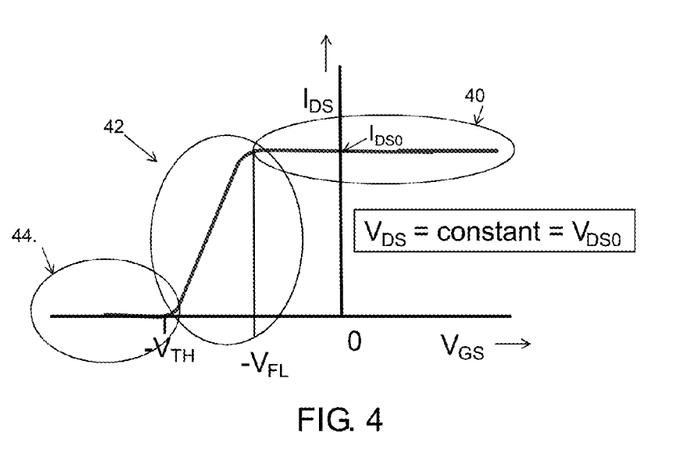
FIG. 4 shows the $I_{DS}$-$V_{GS}$ characteristic of the MISHEMT.

In FIG. 4 the $I_{DS}$-$V_{GS}$ characteristic of the MISHEMT is sketched. The curve also represents the characteristic of the gate-head region (see FIG. 3(a)). In the flat part 40 of the characteristic not all surface donors are ionized, so the 2DEG concentration (and, therefore, the sheet resistance under the gate head) does not change with changing VGS.

The number of surface donors per unit area that are not ionized at zero bias is given by $N_{d,neutral}=C \times V_{FL}/q$, where C is the capacitance between the metal and the 2DEG per unit area. In region 42 between $-V_{FL}$ and $-V_{TH}$ all donors are ionized and the 2DEG concentration decreases with a more negative VGS. In region 44 below $-V_{TH}$ the 2DEG is gone. The values of $V_{FL}$ and $V_{TH}$ depend not only on the thickness of the dielectric but also on the charges present in the dielectric or at its interface with the semiconductor.

Figure 5:
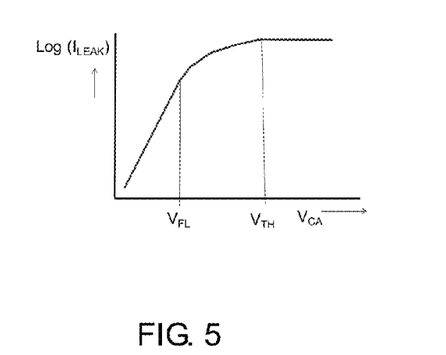
FIG. 5 shows the relation between the MISHEMT curve of FIG. 4 and the leakage current.

FIG. 5 shows the relation between the MISHEMT curve (FIG. 4) and the leakage current. For an anode-cathode voltage $V_{CA}$ between 0 and $V_{FL}$ the 2DEG concentration under the gate head is constant and the electric field near the edge of the metal/semiconductor interface rises strongly with increasing $V_{CA}$ and, hence, the tunnelling current rises strongly. For $V_{FL}<V_{CA}<V_{TH}$ the 2DEG concentration decreases with increasing reverse voltage and the increase in electric field at the gate edge rises less rapidly with reverse voltage because of the stronger lateral depletion of the 2DEG under the gate head.

For $V_{CA}>V_{TH}$ the 2DEG under the gate head is gone and the electric field near the gate edge is constant and, therefore, the leakage current is constant.

Another issue is the drift resistance. The value of $I_{DS0}$ directly gives the resistance of the drift region: $Rdrift=V_{DS0}/I_{DS0}$.

Figure 6:
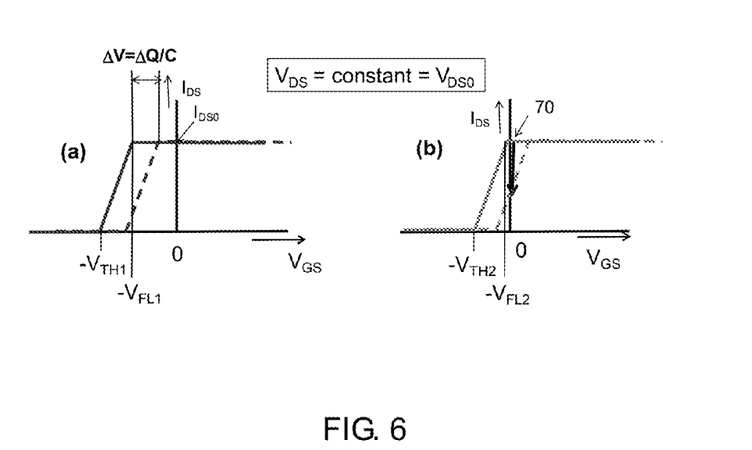
FIG. 6 shows what happens to the value of Rdrift when a certain amount of negative charge ΔQ is added in the dielectric or at its interface with the semiconductor, for two different passivation layer designs.

FIG. 6 shows what happens to the value of Rdrift when a certain amount of negative charge ΔQ is added in the dielectric or at its interface with the semiconductor.

FIGS. 6(a) and 6(b) show the $I_{DS}$-$V_{GS}$ curves for two different (hypothetical) passivation layer designs. The two designs differ only in the amount of charge in the nitride (either the surface donor concentration or the concentration of fixed charge).

The $I_{DS}$-$V_{GS}$ curve shifts to the right (as shown by dashed curves).

For the nitride with the $I_{DS}$-VGS curve of FIG. 6(a) this has no consequence for Rdrift because the concentration of surface donors not ionized is equal to $C \times V_{FL1}$, which is less than the added negative charge ΔQ. So, the amount of ionized surface donors increases by ΔQ/q but still a certain fraction of the donors are neutral, leaving the Fermi level pinned at the donor level, so the 2DEG concentration does not change.

For a nitride with the $I_{DS}$-$V_{GS}$ curve of FIG. 6(b), the addition of the same amount of negative charge in the dielectric, which is now larger than the concentration of surface donors not ionized, leads to a significant increase in Rdrift. This results from the reduction in $I_{DS0}$ shown by arrow 70. Thus, a nitride with an $I_{DS}$-$V_{GS}$ curve of FIG. 6(a) gives a better immunity of the resistance of the device against changes in the dielectric or at the interfaces. (e.g. due to electron injection).

However, as discussed above, such a dielectric gives a larger leakage current than a dielectric with an $I_{DS}$-$V_{GS}$ curve of FIG. 6(b).

Figure 7:
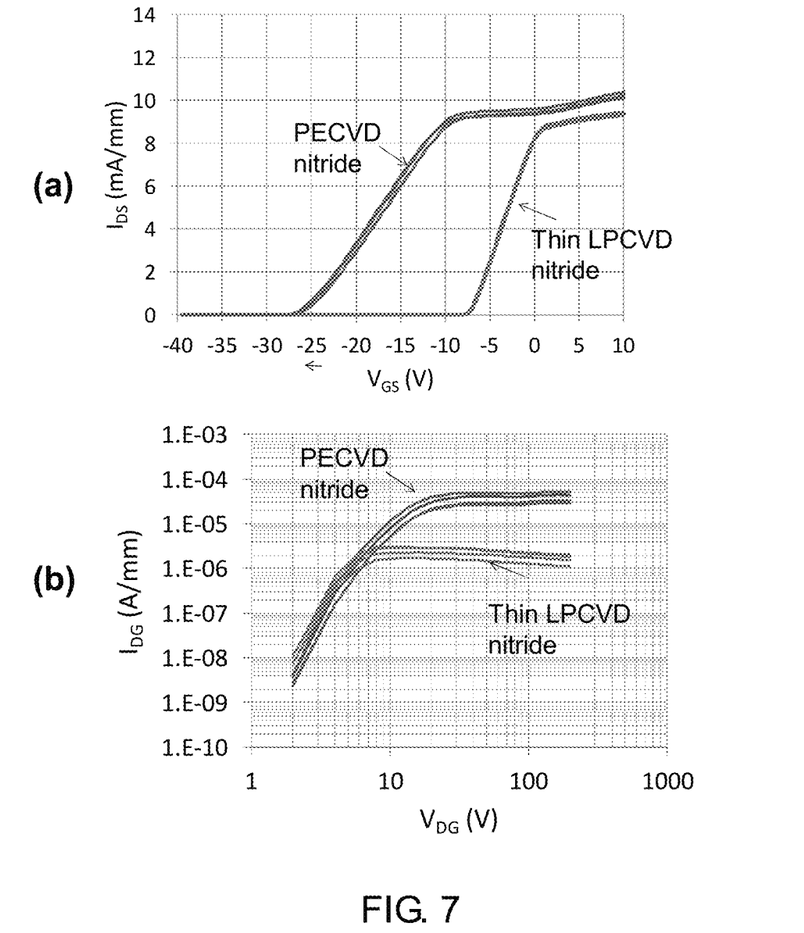
FIG. 7 shows the measured $I_{DS}$-$V_{GS}$ curves and drain-gate leakage current of a MISHEMT.

FIG. 7(a) shows the measured $I_{DS}$-$V_{GS}$ curves of a MISHEMT with 100 nm PECVD nitride and 50 nm LPCVD nitride, and FIG. 7(b) shows the drain-gate leakage current as a function of the drain-gate voltage. These results are for fabricated devices, and the multiple plots relate to different devices of the same design.

As shown in FIG. 7(b), the leakage current remains constant once the reverse bias exceeds the threshold voltage of the MISHEMT and, consequently, the leakage current is lowest for the 50 nm LPCVD nitride.

As can be seen in FIG. 7(a), the PECVD nitride has a value of $V_{FL}$ well below zero, indicating that not all surface donors are ionized, while the LPCVD nitride has a $V_{FL}$ around zero, so all donors are ionized at zero bias. So, the lower $V_{TH}$ of LPCVD nitride is not only caused by the thinner layer (50 nm instead of 100 nm) but also by the fact that all surface donors are ionized at zero bias. This can be due to either:
  a lower surface donor concentration
  less fixed positive charge in the dielectric or at its interface
  more fixed negative charge in the dielectric or at its interface.
  a different spatial distribution of the fixed charge in the dielectric.

The invention provides the addition of a thin dielectric layer, with various design options.

Figure 8:
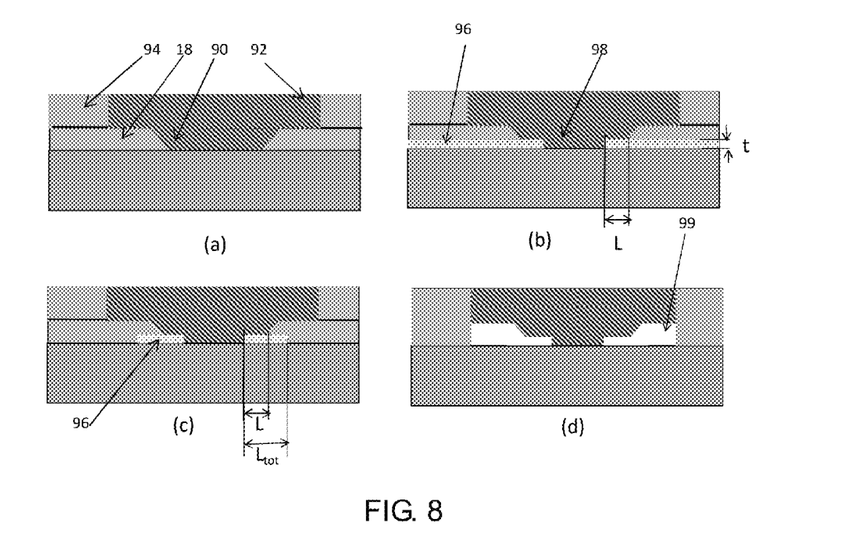
FIG. 8 shows three examples of design of the invention as well as the conventional design for comparison.

FIG. 8(a) shows the known design. There is a lower gate portion 90 (the foot) which is surrounded by the first dielectric layer and an upper gate portion (the head) 92 which is surrounded by the second dielectric layer 94. The lower gate portion has a smaller footprint so that there is an edge region to each side of the lower gate portion which is overlapped by the upper gate portion. The thickness of the first dielectric layer and the shape of the gate edge are optimized, e.g. for breakdown.

FIG. 8(b) shows the addition of a thin dielectric 96 near the edge of the lower gate portion. The addition of the thin dielectric layer has the effect that the threshold voltage of the MISHEMT structure formed by the gate head the thin dielectric 96 and the semiconductor adjacent to the edge of the gate foot is lowered, and, as described above, the leakage current is lowered.

The resulting structure has three layers. The gate foot has a bottom part 98 surrounded by the additional dielectric 96. The top part of the gate foot (which is the middle layer of the three layer gate structure) overlaps the additional dielectric layer 96 by a distance L as shown. The gate head is not changed. The electric field distribution in the rest of the dielectric under and adjacent to the gate head is thus not changed.

The additional dielectric material 96 may or may not be the same as the first dielectric material 18. A realistic thickness (shown as "t" in FIG. 8(b)) is for example 15 nm, and more generally in the range 5 nm to 50 nm.

The extension of this layer L needs only to be a few tens of nanometers, for example 30 nm. Typically, L should be larger than two times the thickness t of the thin dielectric layer.

As shown in FIG. 8(b), the additional dielectric layer 96 can extend well into the drift region and may even cover the full area between gate and drain (and gate and source). This is appropriate with respect to leakage current. However, it is not optimal with respect to immunity of the drift resistance against charge variations on the interfaces or in the nitrides (because $V_{FL}$ is close to zero).

Instead, the additional dielectric material 96 can be limited to the gate edge area, for example extending with a length $L_{tot}$ which is slightly larger than the desired overlap distance L of the top part of the gate foot over the bottom part of the gate foot. This value Ltot can equal the minimum value of L (e.g. at least two times the thickness t) plus a safety margin for process tolerances. This is shown in FIG. 8(c).

There are various options for the choice of the material for the additional dielectric layer.

As discussed above, the threshold voltage of the dielectric for a given thickness can be further reduced by lowering $V_{FL}$. This can be done by choosing the right material (e.g. the LPCVD nitride as presented in FIG. 7) or by modification of the material.

A cavity 99 (air or other gas), as indicated in FIG. 8(d) can be used as a possible material for the thin dielectric. This is obtained by etching away the dielectric, and this can give a low leakage current. This could be realized by wet etching and subsequent deposition of a non-conformal dielectric.

There are also options for the choice of the material of the dielectric in the remaining drift region (i.e. the dielectric layers 18,94). This material should provide a good immunity against charge variations on the interfaces or in the nitrides, i.e. a high $V_{FL}$.

The PECVD material discussed with reference to FIG. 7 is one suitable choice. Modification of this material is also an option, e.g. by doping or plasma treatment. More specifically, the two materials may be the same after deposition. Only after the gate etch, the dielectric in the drift region is modified (e.g. doping, plasma treatment) in order increase $V_{FL}$ to obtain the immunity against charge variations.

In the example above, the thin additional dielectric layer is applied to both the drain and source sides of the gate. It can also be applied to the drain side only.

In the above description the low leakage has been achieved by adding a thin dielectric to the conventional gate edge construction. Low leakage can also be obtained by reducing the dielectric layer thickness under the gate of the conventional gate edge construction. The disadvantage, however, of this is, as compared to the solution above, that the high electric field peak at the edge of the gate head, together with the thin dielectric there, may cause dielectric breakdown or reliability problems.

Figure 9:
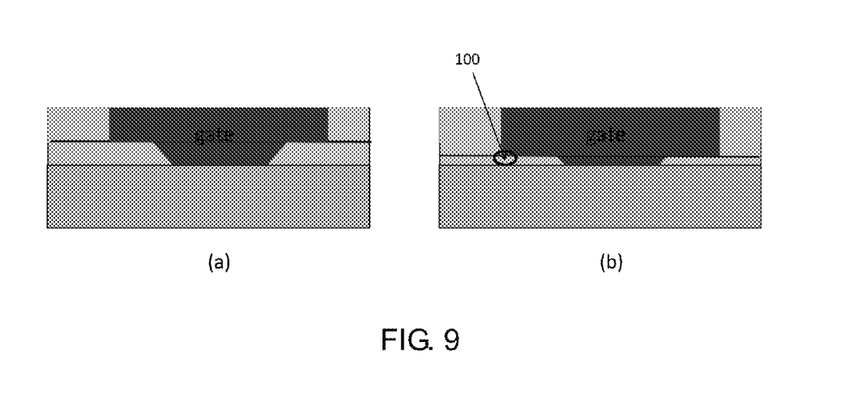
FIG. 9 shows an alternative approach (not within the scope of the invention) for obtaining low leakage by reducing the dielectric layer thickness under the gate of the conventional gate edge construction.

This option is shown in FIG. 9. FIG. 9(a) shows the conventional dielectric stack, and FIG. 9(b) shows a reduced thickness under the gate head, giving rise to possible dielectric breakdown at region 100.

The addition of an additional silicon nitride layer, to provide the combination of two different silicon nitride passivation layers, can be implemented using a combination of plasma enhanced chemical vapor deposition (PECVD) and low pressure chemical vapor deposition (LPCVD). Various possible implementations are possible, two of which are briefly described below.

Figure 10:
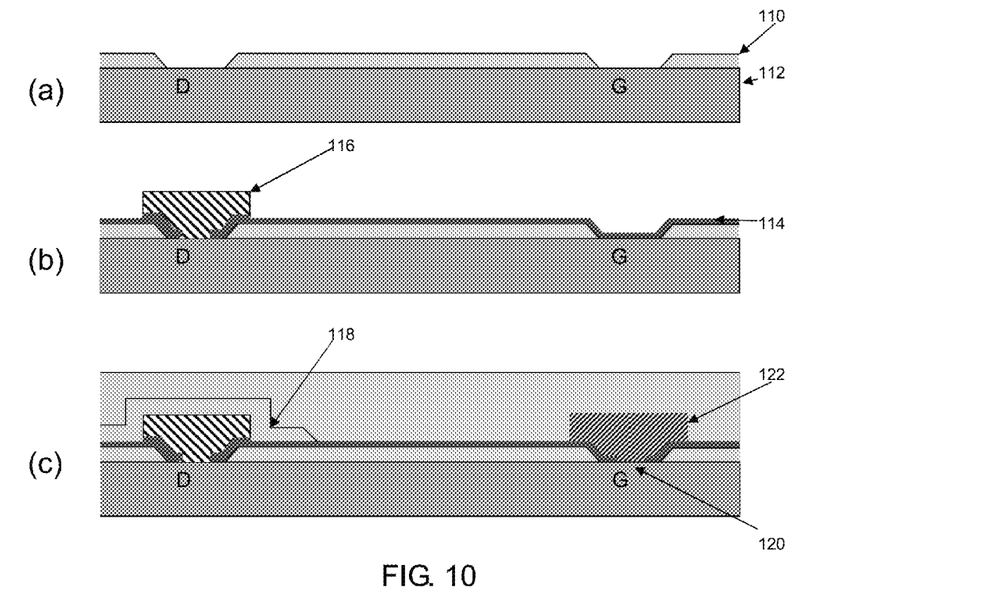
FIG. 10 shows a first example of a sequence of process steps in accordance with the invention.

A first process is shown in FIG. 10. In this process, although the additional thin dielectric layer is lowest in the region of the gate, it is not deposited as the lowest layer, as in the examples of FIGS. 8(b) and 8(c).

The process starts with the deposition of PECVD nitride 110 over the GaN/AlGaN substrate 112, typically at 400° C. After optional annealing of this nitride and lithography, the actual patterning is performed with a buffered oxide etch to form gate and drain (and source for a three terminal device) openings as shown in FIG. 10(a).

This wet etch, which has proven not to impact the 2DEG sheet resistance, creates sloped contacts to the source/drain and gate areas. Instead of opening the source/drain and the gate, it could also be preferred to open the source/drain areas later in the process. The sloped sidewalls however are beneficial for a good step coverage for the respective source/drain and gate metal depositions.

FIG. 10(a) thus shown in cross-section of the GaN substrate wafer after PECVD silicon nitride deposition and patterning in source/drain and gate areas.

The next step is the deposition of LPCVD nitride 114, typically at 850° C., covering again the gate foot and source/drain contacts as shown in FIG. 10(b). Note that LPCVD after PECVD is not a typical order in mainstream manufacturing, since PECVD nitride is considered as a lower quality material and outgassing of hydrogen can occur during the ramp up of the temperature to 850° C. However, this process has been demonstrated to work without any problem.

Patterning of the source/drain contact areas is performed with a dry etch, removing LPCVD nitride inside the PECVD window. Should only the gate area be opened in the previous step, the etch patterns the LPCVD/PECVD stack in one go.

FIG. 10(b) instead shows LPCVD nitride sidewalls present in the source/drain areas, avoiding the metal of the ohmic layer stack to be directly in contact with a low-quality PECVD nitride (layer 110), which has been found to interact during the annealing step.

This annealing step, typically performed at temperatures around 900° C. for one minute, is needed to ensure good ohmic contact to the GaN.

Ohmic metal deposition is performed, typically starting with a bilayer of Ti/Al, and patterning is performed with a dry etch to form the metal drain (and source) contact 116. The etch process consumes part of the LPCVD nitride outside the ohmic contact area as shown in FIG. 10(b), and therefore also in the gate foot.

An additional PECVD nitride deposition immediately after the LPCVD nitride can optionally be used to prevent the variation of LPCVD nitride consumption over the wafer shown in FIG. 10(b).

The next step is PECVD nitride deposition to cover the ohmic contacts before the gate metal is deposited. This cover acts as protection. This cover area is shown as 118 in FIG. 10(c). Removal of the PECVD nitride outside the ohmic contact areas is performed using wet etching after a photo-masking step, using a buffered oxide etch which is very selective to LPCVD nitride. Alternatively, the Schottky gate metal can be deposited without protecting the source/drain contacts with the additional silicon nitride layer 118. This has been demonstrated to work.

In either case, the step before gate metal deposition is gate area patterning by dry etching the LPCVD nitride 114 inside the PECVD window, creating the desired extension of the LPCVD nitride 114 in the gate foot.

The patterned opening is shown as 120 in FIG. 10(c).

After deposition of the gate metal 122, typically starting with nickel, the gate is patterned using photolithography, either dry or wet.

From here, the process follows a standard back end metallization, typically using typically PECVD nitrides as inter-metal dielectrics and thick layers of aluminium.

FIG. 10(c) shows the cross-section after completion of the Schottky gate patterning.

As mentioned above, it is not essential that the source/drain contact areas are opened. The PECVD nitride protecting the ohmic metal before gate metal deposition is also optional.

Figure 11:
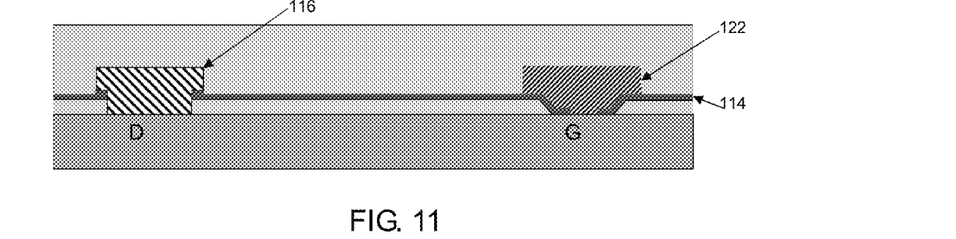
FIG. 11 shows the structure resulting from a first alternative set of process steps.

FIG. 11 shows the structure with no nitride cap and without removing the PECVD layer 110 at the location of the drain contact. In the process to form the device of FIG. 11, the LPCVD nitride 114 is only present inside the gate, not in the source/drain contacts. Subsequently, etching the drain and source contact holes removes both layers 110 and 114 locally in one step.

Instead of the above described process, the LPCVD nitride can be deposited first. One reason to do this is that it is more straightforward in mainstream silicon fabrication plants.

LPCVD furnaces are typically used in a variety of different processes, so outgassing of PECVD nitride may be unwanted from a standard production point of view.

Figure 12:
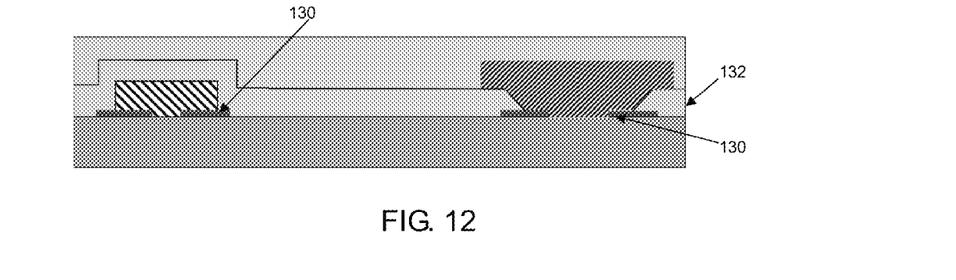
FIG. 12 shows the structure resulting from a second alternative set of process steps.

The process steps are more or less copied from the PECVD-first approach and also several different routes can be taken. One possible end-result is shown in FIG. 12.

The most important difference is the presence of LPCVD nitride 130 inside and outside part of the gate foot definition due to lithography overlay considerations. The PECVD nitride 132 is patterned after the LPCVD nitride patterning, so misalignment tolerances need to be taken into account.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A GaN heterojunction semiconductor device comprising:
   a substrate;
   a layer structure having a first layer having a first bandgap and a second layer having a second bandgap, wherein the first layer is located between the substrate and the second layer; and
   a Schottky gate electrode and a first further electrode each conductively coupled to a different area of the the GaN heterojunction semiconductor device, said Schottky gate electrode comprising a central region and an edge region,
   wherein the Schottky gate electrode comprises:
   a lowermost portion which is co-planar with a first dielectric layer portion over the second layer;
   a middle portion which is co-planar with a second dielectric layer, the middle portion overlapping the lowermost portion; and
   an upper portion which is co-planar with a third dielectric layer, the upper portion overlapping the middle portion.

2. The GaN heterojunction semiconductor device as claimed in claim 1, wherein the first dielectric layer is over the second dielectric layer, and the second dielectric layer has a well in the region of the gate and in which the first dielectric layer is formed such that the first dielectric layer portion is the only one of the first, second and third dielectric layers beneath the overlap of the middle portion over the lowermost portion.

3. The GaN heterojunction semiconductor device as claimed in claim 1, wherein the first dielectric layer comprises an LPCVD layer, and the second and third dielectric layers comprise PECVD layers.

4. The GaN heterojunction semiconductor device as claimed in claim 1, wherein all three dielectric layers comprise SiN.

5. The GaN heterojunction semiconductor device as claimed in claim 1, wherein the length of the overlap of the middle portion over the lowermost portion is at least twice the thickness of the first dielectric layer.

6. The GaN heterojunction semiconductor device as claimed in claim 1, wherein the thickness of the first dielectric layer is in the range 5 to 50 nm.

7. The GaN heterojunction semiconductor device as claimed in claim 1, wherein the first layer comprises GaN and the second layer comprises AlGaN.

8. A method of manufacturing a semiconductor device comprising:
   providing a substrate carrying a layer structure having a first layer having a first bandgap and a second layer having a second bandgap, wherein the first layer is located between the substrate and the second layer, the interface between the first layer and second layer defining a heterojunction;
   forming a dielectric layer structure over the second layer;
   forming a Schottky gate electrode and a first further electrode each conductively coupled to a different area of the heterojunction, said Schottky gate electrode comprising a central region and an edge region, wherein the Schottky gate electrode comprises:
   a lowermost portion which is co-planar with a first dielectric layer portion over the second layer;
   a middle portion which is co-planar with a second dielectric layer, the middle portion overlapping the lowermost portion; and
   an upper portion which is co-planar with a third dielectric layer, the upper portion overlapping the middle portion.

9. The method as claimed in claim 8, wherein forming the dielectric layer structure comprises:
   forming the second dielectric layer;
   forming a well in the second dielectric layer in the region of the gate;
   forming the first dielectric layer over the second dielectric layer and into the well;
   removing a region of the first dielectric layer in the well;
   forming the third dielectric layer over the first dielectric layer,
   wherein the first dielectric layer portion is the only one of the first, second and third dielectric layers beneath the overlap of the middle portion over the lowermost portion.

10. The method as claimed in claim 8, wherein the first dielectric layer is formed by LPCVD.

11. The method as claimed in claim 10, wherein the second and third dielectric layers are formed by PECVD.

12. The method as claimed in claim 8, wherein all three dielectric layers comprise SiN.

13. The method as claimed in claim 8, wherein the length of the overlap of the middle portion over the lowermost portion is at least twice the thickness of the first dielectric layer.

14. The method as claimed in claim 8, wherein the first dielectric layer is formed to a thickness in the range 5 to 50 nm.

15. The method as claimed in claim 8, wherein the first layer comprises GaN and the second layer comprises AlGaN.

* * * * *